United States Patent [19]

Lee

[11] Patent Number: 5,330,927

[45] Date of Patent: Jul. 19, 1994

[54] METHOD OF CONSTRUCTING A REDUCED SIZE HIGHLY INTERGRATED STATIC RANDOM ACCESS MEMORY WITH DOUBLE VERTICAL CHANNEL STRUCTURE

[75] Inventor: Yong H. Lee, Seoul, Rep. of Korea

[73] Assignee: Goldstar Electron Co., Ltd., Chungcheongbuk, Rep. of Korea

[21] Appl. No.: 878,549

[22] Filed: May 5, 1992

[30] Foreign Application Priority Data

May 13, 1991 [KR] Rep. of Korea ................ 7702/1991

[51] Int. Cl.$^5$ ............... H01L 21/70; H01L 27/00
[52] U.S. Cl. ........................ 437/52; 437/59; 437/47; 437/60; 437/203
[58] Field of Search ............... 437/52, 51, 203, 919, 437/47; 257/135, 302, 330, 332

[56] References Cited

U.S. PATENT DOCUMENTS

| | | | |
|---|---|---|---|
| 4,829,017 | 5/1989 | Malhi | 437/47 |
| 4,914,058 | 4/1990 | Blanchard | 437/203 |
| 4,920,065 | 4/1990 | Chin et al. | 437/47 |

Primary Examiner—Olik Chaudhuri
Assistant Examiner—H. Jey Tsai
Attorney, Agent, or Firm—Poms, Smith, Lande & Rose

[57] ABSTRACT

A static random access memory with a double vertical channel structure capable of providing a highly integrated memory element and a method of the same. On a substrate of a first conductivity type, first and second layers of the same conductivity type are formed, in order. On respective surfaces of the three layers, impurity diffusion regions are formed, centers of which are located on a vertical line. The first layer having the second impurity diffusion region and the second layer having the third impurity diffusion region are removed at their center portions, except for their opposite side portions, thereby forming trenches. In these trenches, gate electrodes and a ground electrode are formed. Accordingly, the first impurity diffusion region and the remaining opposite side portions of second and third impurity diffusion regions become source/drain regions, while the remaining opposite side portions of first and second layers become a double vertical channel region.

8 Claims, 4 Drawing Sheets

METHOD OF CONSTRUCTING A REDUCED SIZE HIGHLY INTERGRATED STATIC RANDOM ACCESS MEMORY WITH DOUBLE VERTICAL CHANNEL STRUCTURE

BACKGROUND OF THE INVENTION

1. Field of the Invention

The present invention relates to a static random access memory, and more particularly to a static random access memory with a double vertical channel structure suitable for a highly integrated memory element and a method of the same.

2. Description of the Prior Art

Among various semiconductor memory elements, dynamic random access memories have only one transistor and one capacitor in every memory cell, whereas static random access memories (SRAM) have four transistors and two load resistors made of polysilicon material or six transistors in every memory cell. Due to such a complex structure, SRAMs are restricted by the degree of integration. In order to solve this problem, research for developing highly integrated SRAMs is actively progressing.

FIG. 3 illustrates a circuit of a conventional SRAM cell. As shown in FIG. 3, the SRAM includes four transistors Q1 to Q4 and two load resistors R1 and R2 in every memory cell, all being connected with one another.

The operation of the SRAM having the structure of FIG. 3 will now be described. First, in a write operation, a source voltage $V_{DD}$ from a power source is applied to a word line W/L. At the same time, a bit line BL is also supplied with the source voltage $V_{DD}$ (that is, a critical voltage $V_{th}$), while a bit line $\overline{BL}$ is supplied with 0V. The voltage from the bit line BL is applied to a node a via the transistor Q1, while the voltage from the bit line $\overline{BL}$ is applied to a node b, via the transistor Q2. The voltages applied to nodes a and b are applied to transistors Q4 and Q3, as gate voltages, respectively. As the voltage $V_{DD}$ from the bit line BL supplied to the node a is applied to the transistor Q4 as the gate voltage, the transistor Q4 is turned on. On the other hand, since the voltage (0V) from the bit line $\overline{BL}$ supplied to the node b is applied to the transistor Q3 as the gate voltage, the transistor Q3 is turned off. Thus, one data bit is stored.

On the other hand, in a stand-by state, an electric charge is charged in capacitive components which are formed parasitically at nodes a and b. At this time, the word line W/L is supplied with 0V, so that gate voltages of transistors Q3 and Q4 become 0V, thereby causing the transistors Q3 and Q4 to be turned off. However, a leakage current is presented in capacitive components of nodes a and b, so that electric charges of capacitor components are gradually discharged into the ground GND. As a result, if the leaked electric charge is not supplied, data stored in the SRAM disappears. In order to avoid this phenomenon, load resistors R1 and R2 are connected between the power source $V_{DD}$ and the node a and between the power source $V_{DD}$ and the node b, respectively. With such an arrangement, electric charge corresponding to the amount of leaked electric charge is supplied, so that a constant quantity of electric charge can be maintained in the parasitic capacitive components.

In read operation, the word line W/L is supplied again with the source voltage $V_{DD}$ which is then distributed to nodes a and b and bit lines BL and $\overline{BL}$. At this time, the voltage at bit line BL is relatively high, while the voltage at bit line $\overline{BL}$ is relatively low, because the electric charge from the bit line $\overline{BL}$ is discharged via transistors Q2 and Q4 into the ground GND. Accordingly, the data read operation of the SRAM is to sense the voltage difference between bit lines BL and $\overline{BL}$. At this time, the voltage of bit line BL is determined by resistance values of transistors Q2 and Q4 at their ON-states. The lower the resistance value of transistor Q4 at its ON-state, the lower the voltage of node b. At the higher resistance value of transistor Q2 at its ON-state, the influence of the voltage of bit line $\overline{BL}$ on the voltage of node b is reduced. As a result, it is possible to prevent efficiently an inversion of data in the read operation.

FIG. 4 is a sectional view of a typical conventional SRAM. A method of making this SRAM will now be described, in conjunction with FIG. 4.

First, a silicon substrate 50 having a high resistance is subjected to an ion injection and then a diffusion, thereby forming p-type wells 51 and 52 thereon. Subsequently, a LOCOS (local oxidation of silicon) process is performed, to form field regions 53 for isolating transistors from one another. On the entire surfaces of p-type wells 51 and 52 and field regions 53 is grown a gate oxide film 54. On the gate oxide film 54 is deposited a polysilicon layer which is then subjected to a photo lithography method and an etching method, to form gate electrodes 55.

Although not shown in FIG. 4, a side wall may be then formed on the side surface of each gate electrode 55, so as to produce a transistor having a lightly doped drain structure. Source/drain regions 56 are formed at opposite sides of each gate electrode 55, by injecting n-type ions into p-type wells 51 and 52 disposed at the sides and then diffusing them.

On the entire exposed surfaces, an oxide film 57 is deposited using a CVD (chemical vapor deposition (CVD) method. The oxide film 57 is then subjected to the photo lithography method and the etching method, thereby forming interconnection lines for connecting transistors with one another and buried contacts to which source/drains 56 are connected.

Thereafter, a polysilicon layer is deposited on the entire exposed surface by using the CVD method. The polysilicon layer is subjected to the photo lithography method and the etching method, thereby forming interconnection lines 58. Ions of a conductivity opposite to that of the interconnection lines 58 are injected into the remaining polysilicon layer, thereby forming load resistors 59.

By using the CVD method, a boron phosphorous silicate glass (BPSG) layer is deposited on the entire exposed surface. The BPSG layer 60 is subjected to the photo lithography method and the etching method so that buried contacts are formed above source/drain regions.

Subsequently, an aluminum layer is deposited on the entire exposed surface, using the CVD method, and then subjected to the photo lithography method and the etching method, to remove unnecessary portions thereof, thereby forming source/drain electrodes 61. On the entire exposed H surface, a $Si_3N_4$ film 62 is then formed as a passivation layer. Thereafter, bit lines and word lines are formed on the passivation layer. Since the formation of bit lines and word lines has no relation with the feature of the present invention, a detailed description therefor is omitted.

However, the above-mentioned conventional structure is restricted by a reduction in the memory cell size. That is, the conventional SRAM includes horizontally formed channel regions of transistors which limit a reduction in the memory cell size, since adjacent channel, regions have to maintain a pitch of not less than the minimum line width therebetween. As a result, it is impossible to obtain a desired chip size and still meet the high integration of SRAM.

SUMMARY OF THE INVENTION

Therefore, an object of the invention is to provide a SRAM having a double vertical channel region structure.

Another object of the invention is to provide a method of making a SRAM, enabling a high integration thereof by utilizing a double vertical channel structure and thereby forming four transistors in every memory cell area.

In one aspect, the present invention provides a static random access memory comprising: a substrate of a first conductivity type having at its surface a first impurity diffusion region of a second conductivity type formed to have a predetermined width and a predetermined thickness; a pair of first layers of the first conductivity type formed at positions spaced away from a vertical line passing the center of the first impurity diffusion region in opposite horizontal directions, at a first predetermined distance, respectively, each first layer being provided at its surface with a second impurity diffusion region of the second conductivity type having a predetermined width and a predetermined depth; a pair of second layers of the second conductivity type formed at positions spaced away from the vertical line passing the center of the first impurity diffusion region in opposite horizontal directions, at a second predetermined distance, respectively, each first layer being provided at its surface with a third impurity diffusion region of the second conductivity type having a predetermined width and a predetermined depth; a ground electrode extending vertically from a center portion of the first impurity diffusion region to the surface level of the second layers and having a predetermined width; a pair of first gate electrodes formed at opposite sides of the ground electrode, respectively, to have the same height as that of the ground electrode; a pair of second gate electrodes each formed between each first gate electrode and an inner side surface of each corresponding second layer facing the first gate electrode, to have the same height as that of the second layer; a pair of first insulating regions each formed between the ground electrode and each second gate electrode and adapted to insulate each corresponding first gate electrode from other parts; a pair of second insulating regions each formed between each first gate electrode and the inner side surface of each corresponding second layer facing the first gate electrode and adapted to insulate each corresponding second gate electrode from other parts; a pair of load resistors formed at opposite outer side surfaces of the first layers, respectively, each, load resistor being in contact with each second impurity diffusion region; and a pair of third insulating regions each formed between the outer side surface of each first layer and each corresponding load resistor.

In another aspect, the present invention provides a method of making a static random access memory comprising the steps of: forming, on a substrate of a first conductivity type, an impurity diffusion region of a second conductivity type functioning as a first source/drain region and having a predetermined width and a predetermined thickness; forming a first layer of the first conductivity type having a predetermined thickness, on the entire surface of the substrate; forming a second impurity diffusion region of the second conductivity type having a predetermined thickness, on the entire surface of the first layer; forming a second layer of the first conductivity type having a predetermined thickness, on the entire surface of the first layer; forming a third impurity diffusion region of the second conductivity type having a predetermined width and a predetermined thickness, on the second layer, such that the center of the third impurity diffusion region is located on a vertical line passing the center of the first impurity diffusion region; forming a first trench extending from the surface of the third impurity diffusion region to the surface of the second impurity diffusion region and having a width less than that of the third impurity diffusion region, based on the center of the third impurity diffusion region so that respective remaining portions of the third impurity diffusion region and the second layer at opposite sides of the first trench become a second source/drain region and a first vertical channel region; forming first gate electrodes at opposite sides of the first trench, respectively; and forming a first insulating region around each first gate electrode, the first insulating region functioning to insulate electrically the first gate electrode from other parts; forming a second trench extending from the remaining bottom portion of the first trench to the surface of the first impurity diffusion region and having a width corresponding to the width of the remaining bottom portion of the first trench so that respective remaining portions of the second impurity diffusion region and the first layer at opposite sides of the second trench become a third source/drain region and a second vertical channel region; forming second gate electrodes at opposite sides of the second trench, respectively, and forming a second insulating region around each second gate electrode, the second insulating region functioning to insulate electrically the second gate electrode from other parts; forming a ground electrode at a portion of the second trench defined between second insulating regions, the portion corresponding to the remaining center portion of the second trench; forming a third trench at a portion of the second layer corresponding to a region defined between adjacent memory cells; and forming third insulating regions and load resistors being in contact with the first layer, at opposite sides of the third trench, respectively.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
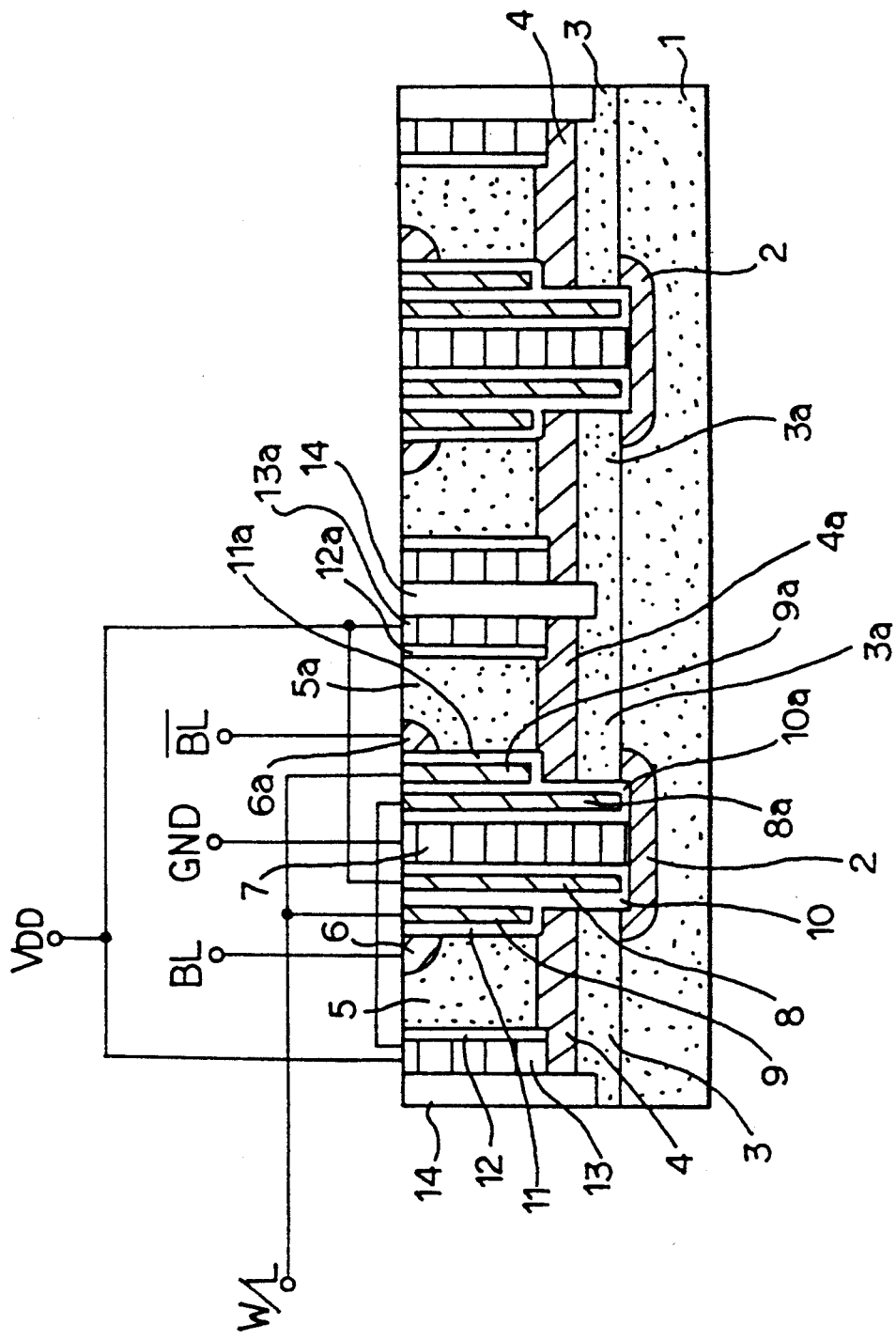
FIG. 1 is a sectional view of a SRAM having a double vertical channel structure according to the present invention.

Referring to FIG. 1, there is illustrated a sectional view of a SRAM according to an embodiment of the present invention. As shown in FIG. 1, the SRAM comprises a p-type substrate 1 having at its surface a first impurity diffusion region 2 of n+-type, in every memory cell area. Two p-type first epitaxial layers 3 and 3a are formed at positions spaced away from a vertical line passing the center of first impurity diffusion region 2 in opposite horizontal directions, at a first predetermined distance, respectively. On surfaces of p-type first epitaxial layers 3 and 3a, second impurity diffusion regions of n+-type 4 and 4a are formed, respectively. Two p-type second epitaxial layers 5 and 5a are also formed at positions spaced away from a vertical line passing the center of first impurity diffusion region 2 in opposite horizontal directions, at a second predetermined distance, respectively. On surfaces of p-type second epitaxial layers 5 and 5a, third impurity diffusion regions of n+-type 6 and 6a are formed, respectively. Through the vertical line passing the center of first impurity diffusion region 2, a ground electrode 7 extends vertically from the surface level of second epitaxial layers 5 and 5a to the surface level of first impurity diffusion region 2 so that it is in contact with the surface of first impurity diffusion region 2. At both sides of the ground electrode 7, a pair of first gate electrodes 8 and 8a are formed which extend vertically to the surface of first impurity diffusion region 2. At outer sides of first gate electrodes 8 and 8a, a pair of second gate electrodes 9 and 9a are formed which extend vertically to surfaces of second impurity diffusion regions 4 and 4a and have a predetermined width, respectively. In order to insulate the first gate electrodes 8 and 8a from other parts, a pair of first insulating regions 10 and 10a are provided between the ground electrode 7 and the second gate electrode 9 and between the ground electrode 7 and the second gate electrode 9a, respectively. A pair of second insulating regions 11 and 11a are also provided between the inner side surface of second epitaxial layer 5 and the first insulating region 10 and between the inner side surface of second epitaxial layer 5a and the first insulating region 10a, respectively, in order to insulate the second gate electrodes 9 and 9a from other parts. At outer side surfaces of second epitaxial layers 5 and 5a, a pair of third insulating regions 12 and 12a having a predetermined thickness are formed, respectively. Finally, a pair of load resistors 13 and 13a are formed between the third insulating region 12 and a region 14 for isolating the memory cell from adjacent memory cell at one side and between the third insulating region 12a and another region 14 for isolating the memory cell from adjacent memory cell at the other side, respectively. The load resistors 13 and 13a extend from the surface level of second epitaxial layer 5 and 5a to the surface level of second impurity diffusion regions 4 and 4a, so as to be in contact with the second impurity diffusion regions, respectively.

Thereafter, the ground electrode 7 is connected to the ground GND, as shown in FIG. 1. On the other hand, third impurity diffusion regions 6 and 6a are connected to bit lines BL and $\overline{BL}$, respectively. The second gate electrodes 9 and 9a are connected in common to a word line W/L, while the load resistors 13 and 13a and the first gate electrodes 8 and 8a are connected to a power source $V_{DD}$. Each isolating region 14 for isolating adjacent memory cells from each other is made of an oxide film and extends from the surface level of second epitaxial layers 5 and 5a to a level in the first epitaxial layer 3 or 3a. The symbol + of the above-mentioned character n+ means an injection of relatively highly concentrated impurities.

The second impurity diffusion regions 4 and 4a are used as common source/drain regions of transistors. The double vertical channels of transistors are provided by the first epitaxial layers 3 and 3a vertically formed between the first impurity diffusion region 2 and respective second impurity diffusion regions 4 and 4a and by the second epitaxial layers 5 and 5a vertically formed between respective second impurity diffusion regions 4 and 4a and respective corresponding third impurity diffusion regions 6 and 6a.

In the structure shown in FIG. 1, the first gate electrodes 8 and 8a and the second gate electrodes 9 and 9a are made of polycrystalline silicon, the ground electrode 7 is made of a metal material, and the load resistors 13 and 13a are made of poly crystalline silicon or metal material. In place of these materials, of course, other materials capable of providing the same functions may be used, without limitation.

FIGS. 2a to 2g are sectional views illustrating a method of making SRAM having the double vertical channel structure according to the present invention.

Figure 2A:
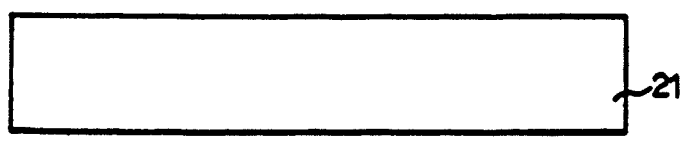
FIGS. 2a to 2g are sectional views illustrating a method of making a SRAM having a double vertical channel structure according to the present invention.
Figure 2B:
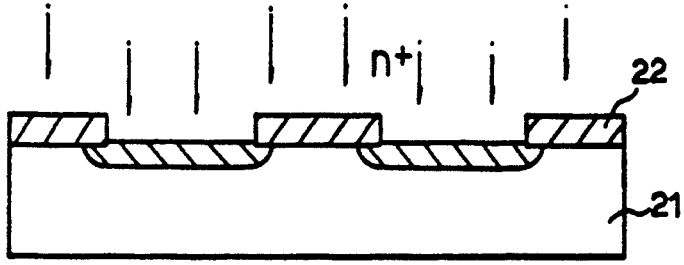
Figure 2C:
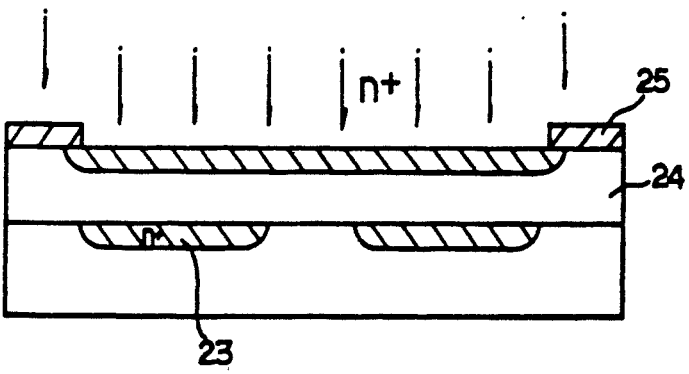

First, a P-type substrate 21 is prepared, as shown in FIG. 2a. In the P-type substrate 21, first impurity diffusion regions are defined by using a photoresist 22 as a mask, as shown in FIG. 2b. Into the surface portions of p-type substrate 21 corresponding to the first impurity diffusion region, n+-type impurity of high concentration is injected, to form the first impurity diffusion regions which are designated by the reference numeral "23", as shown in FIG. 2c. After removal of the photoresist 22, a p-type first epitaxial layer 24 having a predetermined thickness is grown on the entire surface of p-type substrate 21, as shown in FIG. 2c.

Figure 2D:
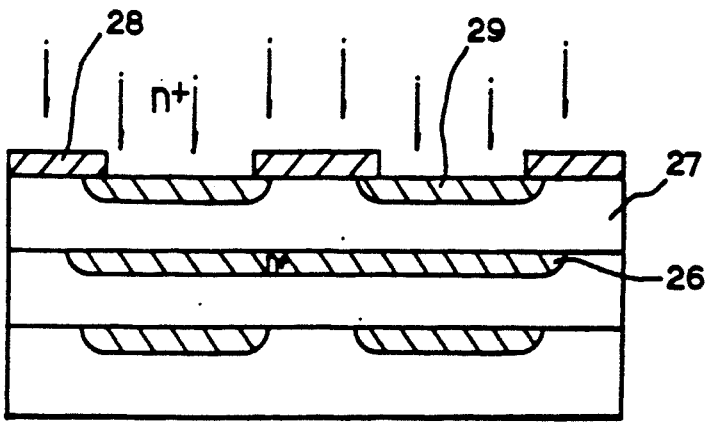

Using a photoresist 25, thereafter, a second impurity diffusion region 26 having a width greater than the total width of first impurity diffusion regions 23 is defined on the surface portion of first epitaxial layer 24 above the first impurity diffusion regions 23. Into the defined surface portion of first epitaxial layer 24, n+-type impurity of high concentration is injected, to form the second impurity diffusion region which is designated by the reference numeral "26", as shown in FIG. 2d. This second impurity diffusion region 26 is formed to have a sufficient width such that it is also occupied by adjacent memory cell in common. After removal of the photoresist 25, a p-type second epitaxial layer 27 is grown on the entire surface of first epitaxial layer 24, as shown in FIG. 2d.

Thereafter, third impurity diffusion regions are defined, using a photoresist 28 having the same pattern as that of photoresist 22 shown in FIG. 2b. Into the defined surface portions of second epitaxial layer 27, n+-type impurity of high concentration is injected, to form the third impurity diffusion regions which are designated by the reference numeral "29", as shown in FIG. 2d.

Figure 2E:
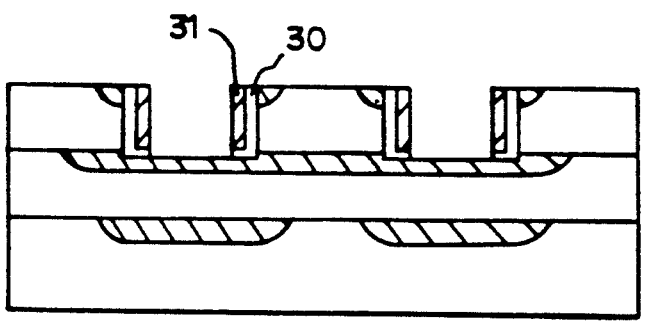

The third impurity diffusion regions 29 are then subjected to a photo lithography method and a dry etching method, so that only opposite side portions of each third impurity diffusion region 29 remain, as shown in FIG. 2e. At this time, the etching is performed until the surface of second impurity diffusion region 26 formed on the first epitaxial layer 27 is exposed. As a result, first trenches having a predetermined width and the same thickness as that of the second epitaxial layer 27 are formed in the second epitaxial layer 27. The remaining opposite side portions of each third impurity diffusion region 29 are used as the first source regions or the first drain regions of SRAM. At opposite side surfaces and bottom surface of each first trench, a first insulating region 30 (for example, oxide films) and a first gate electrode 31 (for example, polysilicon films or metal films) are formed in order.

Figure 2F:
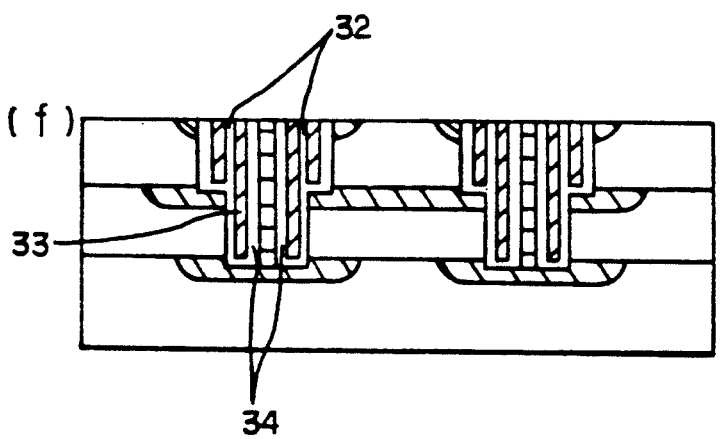

Thereafter, only the exposed bottom portion of each first trench which has a reduced width due to the formation of first insulating films 40 and first gate electrodes 31 is subjected to a dry etching, so that respective portions of second impurity diffusion region 26 and first epitaxial layer 24 beneath the reduced first trenches are removed, thereby forming a second trench, as shown in FIG. 2f. That is, the etching is performed until the surface of each first impurity diffusion region 23 on the substrate 31 is exposed. As a result, each first insulating region 30 is divided into two isolated portions. In similar, each first gate electrode 31 is divided into two isolated portions. At this time, each isolated portion of first insulating region 30 has a horizontal portion disposed beneath each corresponding isolated portion of first gate electrode 31. The width of each second trench corresponds to the value obtained by subtracting the total width of each first insulating region 30 and each first gate electrode 31 from the width of each first trench. The remaining portions of second impurity diffusion region 26 disposed at opposite side portions of each second trench are used as second source regions or second drain regions.

At opposite side surfaces and bottom surface of each second trench, a second insulating region 32 (for example, oxide films) and a second gate electrode 33 (for example, polysiliconfilms or metal films) are formed in order, to extend vertically from the top of each first trench to the bottom of each second trench. Using a dry etching, thereafter, the bottom portion of each second gate electrode 33 and the bottom portion of each second insulating region 32 disposed beneath the bottom portion of each corresponding second gate electrode 33 are removed to expose the surface portion of each corresponding first impurity diffusion region 23 disposed beneath the bottom portion of second gate electrode 33. As a result, each second insulating region 32 is divided into two isolated portions. In similar, each second gate electrode 33 is divided into two isolated portions. At this time, each isolated portion of second insulating region 32 has a horizontal portion disposed beneath each corresponding isolated portion of second gate electrode 33.

In each second trench 33 having a reduced width, a third insulating region 34 (for example, an oxide film) is filled. Each third insulating region 34 is subjected to a photo lithography and a dry etching, so as to remove its center portion having a predetermined width. At this time, the etching is performed until the surface portion of each first impurity diffusion region 23 on the substrate 21 is exposed. With this structure, each second gate electrode 33 is insulated from other parts, by virtue of each corresponding portion of second insulating region 32 and each corresponding portion of third insulating portion 34 formed at opposite side surfaces of the second gate electrode 33. At the removed center portion of each third insulating portion 34, a ground electrode 35 (for example, a metal electrode) is formed.

Figure 2G:
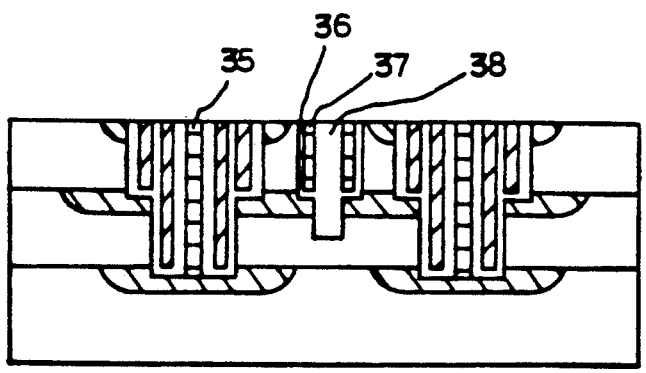
Figure 3:
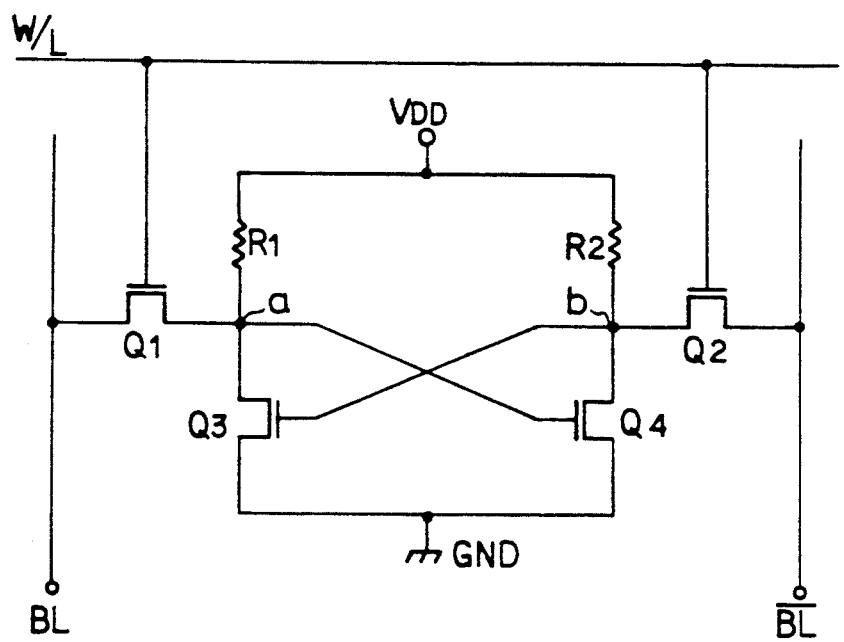
FIG. 3 is a circuit diagram illustrating a conventional SRAM.
Figure 4:
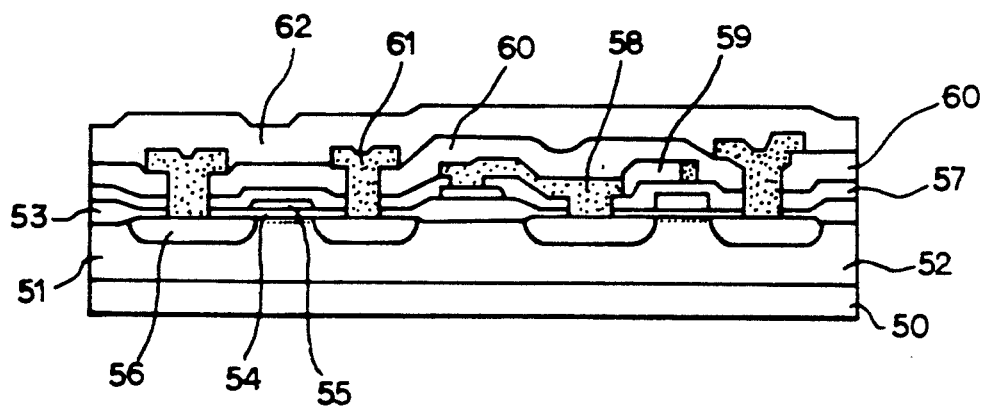
FIG. 4 is a sectional view of a conventional structure of SRAM.

Thereafter, a load resistor and an isolating region are formed between adjacent memory cells, as shown in FIG. 2g. For forming the isolating region, the portion of second epitaxial layer 27 disposed between adjacent memory cell is first subjected to a photo lithography and a dry etching, to form a third trench having a predetermined width. At this time, the etching is performed until the surface portion of second impurity diffusion region 26 is exposed. At opposite side surfaces and bottom surface of the third trench, a fourth insulating film 36 (for example, an oxide film) and a load resistor 37 (for example, a metal electrode) are formed in order, so long as they do not fill completely the third trench. Thereafter, the bottom portion of load resistor 37 corresponding to the remaining bottom portion of third trench is subjected to a dry etching, to form a fourth trench. The dry etching is performed until a predetermined depth portion in first epitaxial layer 24 is exposed. The width of fourth trench corresponds to the value obtained by subtracting the total width of fourth insulating film 36 and load resistor 37 from the width of third trench. Thereafter, an oxide film is formed in the fourth trench, to fill it completely. Thus, an isolating region 38 is obtained.

As apparent from the above description, in forming transistors of SRAM, a double vertical structure is provided at the channel region of each transistor, in accordance with the present invention. By virtue of this double vertical structure, the cell size of SRAM can be greatly reduced. Accordingly, the present invention is very advantageous in providing a high integration of elements.

Although the preferred embodiments of the invention have been disclosed for illustrative purpose, those skilled in the art will appreciated that various modifications, additions and substitutions are possible, without departing from the scope and spirit of the invention as disclosed in the accompanying claims.

What is claimed is:

1. A method of making a static random access memory comprising the steps of:

forming, on a substrate of a first conductivity type, an impurity diffusion region of a second conductivity type functioning as a first source/drain region;

forming a first layer of the first conductivity type, on the substrate;

forming a second impurity diffusion region of the second conductivity type, on the first layer;

forming a second layer of the first conductivity type, on the first layer;

forming a third impurity diffusion region of the second conductivity type, on the second layer, such that the center of the third impurity diffusion region is located on a vertical line passing the center of the first impurity diffusion region;

forming a first trench extending from the surface of the third impurity diffusion region to the second impurity diffusion region and having a width less than that of the third impurity diffusion region, based on the center of the third impurity diffusion region so that respective remaining portions of the third impurity diffusion region and the second layer at opposite sides of the first trench become a second source/drain region and a first vertical channel region;

forming first gate electrodes at opposite sides of the first trench, respectively, and forming a first insulating region around each first gate electrode, the first insulating region functioning to insulate electrically the first gate electrode from other parts;

forming a second trench extending from the remaining bottom portion of the first trench to the surface of the first impurity diffusion region and having a width corresponding to the width of the remaining bottom portion of the first trench so that respective remaining portions of the second impurity diffusion region and the first layer at opposite sides of the second trench become a third source/drain region and a second vertical channel region;

forming second gate electrodes at opposite sides of the second trench, respectively, and forming a second insulating region around each second gate electrode, the second insulating region functioning to insulate electrically the second gate electrode from other parts;

forming a ground electrode at a portion of the second trench defined between second insulating regions, the portion corresponding to the remaining center portion of the second trench;

forming a third trench at a portion of the second layer corresponding to a region defined between adjacent memory cells; and forming third insulating regions and load resistors being in contact with the first layer, at opposite sides of the third trench, respectively.

2. A method of making a static random access memory as claimed claim 1, further comprising the steps of:

forming a fourth trench extending from the remaining bottom portion of the third trench to the first layer and having a width corresponding to the width of the remaining bottom portion of the third trench; and forming an isolating region at the fourth trench, so as to isolate adjacent memory cell from each other.

3. A method of making a static random access memory as claimed in claim 1, wherein the first and second layers of the first conductivity type are formed using an epitaxial growth method.

4. A method of making a static random access memory as claimed in claim 11, wherein respective materials of the first and second layers are polycrystalline silicon.

5. A method of making a static random access memory as claimed in claim 1, wherein respective materials of the first and second gate electrodes and load resistors are poly crystalline silicon.

6. A method of making a static random access memory as claimed in claim 1, wherein a material of the load resistors is a metal.

7. A method of making a static random access memory as claimed in claim 1, wherein respective widths of ground electrode is a metal.

8. A method of making a static random access memory as claimed in claim 11, wherein respective widths of the first, second and third impurity diffusion regions satisfy the following relationship:

$$W1 < W3 < W2$$

where,
- W1: the width of the first impurity diffusion region,
- W2: the width of the second impurity diffusion region, and
- W3: the width of the third impurity diffusion region.

* * * * *

UNITED STATES PATENT AND TRADEMARK OFFICE
CERTIFICATE OF CORRECTION

PATENT NO. : 5,330,927
DATED : July 19, 1994
INVENTOR(S) : LEE

It is certified that error appears in the above-identified patent and that said Letters Patent is hereby corrected as shown below:

Column 10, Line 11, change "claim 11" to --claim 1--;

Line 12, change "polycrystalline" to --poly crystalline--;

Line 24, change "claim 11" to --claim 1-.

Signed and Sealed this

Twelfth Day of January, 1999

Attest:

*Attesting Officer*     *Acting Commissioner of Patents and Trademarks*